United States Patent
Lin

(10) Patent No.: US 6,306,247 B1
(45) Date of Patent: Oct. 23, 2001

(54) APPARATUS AND METHOD FOR PREVENTING ETCH CHAMBER CONTAMINATION

(75) Inventor: Cheng Chih Lin, Hsin-Chu (TW)

(73) Assignee: Taiwan Semiconductor Manufacturing Company, Ltd, Hsinchu (TW)

( * ) Notice: Subject to any disclaimer, the term of this patent is extended or adjusted under 35 U.S.C. 154(b) by 0 days.

(21) Appl. No.: 09/552,582

(22) Filed: Apr. 19, 2000

(51) Int. Cl.[7] .............................. H05H 1/00; C23C 16/00
(52) U.S. Cl. .................... 156/345; 118/723 I; 118/723 E
(58) Field of Search .......................... 156/345; 118/715, 118/723 I, 723 E, 723 MW, 71 G

(56) References Cited

U.S. PATENT DOCUMENTS 6,009,831 * 1/2000 Hwang ........................ 118/723 E 6,156,151 * 12/2000 Komino et al. ..................... 156/345

* cited by examiner

Primary Examiner—Gregory Mills
Assistant Examiner—P. Hassanzadeh
(74) Attorney, Agent, or Firm—Tung & Associates

(57) ABSTRACT

An apparatus and a method for preventing particle contamination in a plasma etch chamber equipped with a middle chamber by residual etchant gas is provided. In the apparatus, a bypass exhaust conduit is provided for connecting between a middle chamber cavity and a main chamber cavity such that when a pump means is turned on to evacuate the main chamber cavity, any residual etchant gas in the middle chamber cavity can be rapidly evacuated without the dancer of causing metal corrosion in the middle chamber cavity. Any chamber contamination caused by the metal corrosion can thus be avoided.

9 Claims, 1 Drawing Sheet

APPARATUS AND METHOD FOR PREVENTING ETCH CHAMBER CONTAMINATION

FIELD OF THE INVENTION

The present invention generally relates to an apparatus and a method for operating an etch chamber with reduced contamination and more particularly, relates to an apparatus and a method for preventing residual etchant gas in the middle chamber of an etch chamber from attacking metal sidewalls of the middle chamber by providing a bypass exhaust conduit to evacuate any residual etchant gas.

BACKGROUND OF THE INVENTION

In the fabrication of semiconductor devices, particularly in the fabrication of sub-micron scale semiconductor devices, profiles obtained in etching process are very important. A careful control of a surface etch process is therefore necessary to ensure directional etching. In conducting an etching process, when an etch rate is considerably higher in one direction than in the other directions, the process is called anisotropic. A reactive ion etching (RIE) process assisted by plasma is frequently used in an anisotropic etching of various material layers on top of semiconductor substrate. In plasma enhanced etching processes, the etch rate of a semiconductor material is frequently larger than the sum of the individual etch rates for ion sputtering and individual etching due to a synergy in which chemical etching is enhanced by ion bombardment.

To avoid subjecting a semiconductor waiver to high-energy ion bombardment, the wafer may also be placed downstream from the plasma and outside the discharge area. Downstream plasma etches more in an isotropic manner since there are no ions to induce directional etching. The downstream reactors are frequently used for removing resist or other layers of material where patterning is not critical. In a downstream reactor, radio frequency may be used to generate long-lived active species for transporting to a wafer surface relocated remote from the plasma. Temperature control problems and radiation damage are therefore significantly reduced in a downstream reactor. Furthermore, the wafer holder can be heated to a precise temperature to increase the chemical reaction rate, independent of the plasma.

In a downstream reactor, an electrostatic wafer holding device known as an electrostatic chuck is frequently used. The electrostatic chuck attracts and holds a wafer positioned on top electrostatically. The electrostatic chuck method for holding a wafer is highly desirable in the vacuum handling and processing of wafers. An electrostatic chuck device can hold and move wafers with a force equivalent to several tens of Torr pressure, in contrast to a conventional method of holding wafers by a mechanical clamping method.

Referring initially to FIG. 1, wherein a conventional inductively coupled plasma etched chamber 10 is shown. In the etch chamber 10, which typically represents one that is commercially available as a LAM TCP etcher, the plasma source is a transformer-coupled source that generates a high density, low pressure plasma away from a wafer surface. The plasma source allows an independent control of ion flux and ion energy. The plasma can be generated by a flat spiral coil (not shown), i.e. an inductive coil separated from the plasma by a dielectric plate 12 which is normally fabricated of a ceramic material with a gas inlet 14 provided therein. The ceramic plate 12 may be a dielectric window made of a substantially transparent material such as quartz to facilitate visual observation of the middle chamber 20. The middle chamber 20 is further formed by a bottom ceramic plate 16 equipped with an apertured opening 18 for allowing a plasma to pass thereto. The sidewall 22 of the middle chamber 20 is normally formed of a metallic material, such as aluminum, with an anodized aluminum surface. The top ceramic plate 12, the bottom ceramic plate 16 and the metallic sidewall 22 form a self-contained chamber, i.e. the middle chamber 20 which has a first cavity 24 therein.

A wafer 30 is positioned on the electrostatic chuck (or ESC) 26 sufficiently away from the RF coil (not shown) such that it is not affected by the electromagnetic field generated by the RF coil. A typical LAM TCP plasma etcher enables a high density plasma to be produced and a high etch rate to he achieved. In the plasma etcher 10, an inductive supply and a bias supply are further used to generate the necessary plasma field. In a typical inductively coupled RF plasma etcher 10, shown in FIG. 1, a source frequency of 13.5 MHZ and a substrate bias frequency of 13.5 MHZ are utilized such that ion density of about $0.5 \sim 2.0 \times 10^{12}$ cm$^3$ is obtained at the wafer level, while electron temperature of 3.5~6.0 eV and a chamber pressure of 1~25 mTorr are achieved.

In the plasma chamber 10, after the wafer 30 is etched in the main chamber 32, the chamber is normally evacuated of the etchant gas from the middle chamber 20 and from the main chamber 32 by a turbo pump 34 controlled by a gate valve 36. The turbo pump is further connected to a dry pump 38 through a control valve 42. When the pressure in the chamber is too high, in order not to damage the turbo pump 34, control valve 42 closes while control valve 44 opens to allow the chamber to be evacuated by the dry pump 38 directly. Simultaneous with the pumping process, an inert purge gas such as nitrogen is flown into the middle chamber 20 and the main chamber 32 through gas inlet 14 to further facilitate the removal of residual etchant gas.

In the conventional plasma chamber 10, a problem caused by the residual etchant gas left in the cavity 24 of the middle chamber 20 frequently occurs. The residual etchant gas cannot be evacuated from cavity 24 due to the small holes in the apertured opening 18 situated in the bottom ceramic plate 16. The small holes do not allow a fast flow rate so that the evacuation of the middle chamber 20 is ineffective. The residual etchant gas left in cavity 24 attacks the metal sidewall 22 and thus causing corrosion in the metal. The corrosion of metal, for instance of an aluminum surface, produces particles which contribute to a severe contamination problem for the main chamber 32 where a wafer is positioned.

It is therefore an object of the present invention to provide a plasma etch chamber that does not have the drawbacks or shortcomings of a conventional plasma etch chamber.

It is another object of the present invention to provide a plasma etch chamber that is equipped with a middle chamber that has significantly reduced particle contamination problem.

It is a further object of the present invention to provide a plasma etch chamber that is equipped with a middle chamber and a main chamber which has significantly reduced contamination problem by evacuating residual etchant gas from the middle chamber.

It is another further object of the present invention to provide a plasma etch chamber that is equipped with a middle chamber for feeding an etchant gas plasma into a main chamber that has significantly reduced particle contamination problem.

It is still another object of the present invention to provide a plasma etch chamber that has a middle chamber and a main chamber equipped with a bypass exhaust conduit connecting the middle chamber to the main chamber.

It is yet another object of the present invention to provide a plasma etch chamber that has a middle chamber and a main chamber in fluid communication through an apertured opening and a bypass exhaust conduit.

It is still another further object of the present invention to provide a method for preventing corrosion in an etch chamber by residual etchant gas wherein the etch chamber is equipped with a middle chamber and a main chamber.

It is yet another further object of the present invention to provide a method for preventing particle contamination in an etch chamber by providing a bypass exhaust conduit connecting between a middle chamber and a main chamber such that residual etchant gas can be evacuated from the middle chamber.

SUMMARY OF THE INVENTION

In accordance with the present invention, an apparatus and a method for preventing particle contamination in an etch chamber are provided.

In a preferred embodiment, a plasma etch chamber is provided which includes a main chamber that has a first cavity, a wafer platform and a spent etchant gas outlet in fluid communication with a pump means for exhausting a spent etchant gas; a middle chamber that has a second cavity therein situated inside the first cavity and suspended over the wafer platform; the middle chamber is formed by a top ceramic plate, a bottom ceramic plate and a metal sidewall; the second cavis is in fluid communication with the first cavity through an apertured opening situated in the bottom ceramic plate for feeding an exhaust gas plasma into the first cavity; the second cavity is in fluid communication with an etchant gas source through an etchant gas inlet situated in the top ceramic plate; and a bypass exhaust conduit providing fluid communication between the second cavity in the middle chamber through an opening in the top ceramic plate and the first cavity in the main chamber such that any residual etchant gas in the second cavity is evacuated by the pump means through the first cavity without causing corrosion in the metal sidewall of the middle chamber.

In the plasma etched chamber, the main chamber may have a volume that is at least twice the volume of the second cavity in the middle chamber. The wafer platform may be an electrostatic chuck. The apertured opening in the bottom ceramic plate may be a shower head for dispersing an etchant gas plasma into the first cavity of the main chamber. The bypass exhaust conduit allows the residual etchant gas to flow therethrough at a flow rate at least twice the flow rate of the residual etchant gas flown through the apertured opening in the bottom ceramic plate. The spent etchant gas outlet may be in fluid communication with a turbo pump, or maybe in fluid communication through a gate valve for controlling a passageway of the spent etchant gas, the top ceramic plate and the bottom ceramic plate may be formed of a ceramic material that is resistant to the etchant gas plasma. The metal sidewalls of the middle chamber may be formed of aluminum. The etchant gas plasma may be formed of at least one member selected from the group consisting of $Cl_2$ or $BCl_3$ in the middle chamber by a radio frequency coil.

The present invention is further directed to a method for preventing corrosion in an etch chamber by residual etchant gas which can be carried out by the operating steps of first providing an etch chamber that includes a main chamber and a middle chamber, the main chamber further includes a first cavity and a wafer platform with the middle chamber suspended over the wafer platform, the middle chamber further includes a top ceramic plate that has an etchant gas inlet therethrough, a bottom ceramic plate that has an apertured opening for passing an etchant gas plasma therethrough and metal sidewalls defining a second cavity; connecting, a bypass exhaust conduit between the first cavity in the main chamber and the second cavity in the middle chamber for providing an unrestricted flow of residual etchant gas from the second cavity after an etching process; conducting an etching process on a wafer in the main chamber; and evacuating, residual etchant gas from the second cavity through the apertured opening and the bypass exhaust conduit by a pump means.

The method for preventing corrosion in an etch chamber by residual etchant gas may further include the step of evacuating residual etchant gas from the second cavity by a turbo pump, or the step of mounting a gate valve between the second cavity and the pump means. The method may further include the step of providing the wafer platform in an electrostatic chuck, or the step of positioning a wafer on the wafer platform for carrying out an etching process. The method may further include the step of providing the apertured opening in a shower head for dispersing an etchant gas plasma into the first cavity for etching a wafer. The method may further include the step of evacuating more than half of the residual etchant gas from the second cavity through the bypass exhaust conduit. The method may further include the step of evacuating more than ¾ of the residual etchant gas from the second cavity through the bypass exhaust conduit. The method may further include the step of providing the metal sidewall in aluminum, or the step of igniting the plasma in the etchant gas flown into the second cavity.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for preventing etch chamber contamination caused by corrosion in the middle chamber wall by residual etchant gas due to poor evacuation through an apertured opening connecting the middle chamber and the main chamber.

In the novel apparatus, a bypass exhaust conduit is added to the etch chamber providing fluid communication between a cavity in the middle chamber and a cavity in the main chamber such that when a pump means is used to evacuate the main chamber cavity residual etchant gas in the middle chamber cavity can be rapidly exhausted out of the middle chamber. The metal sidewall in the middle chamber can thus be prevented from being etched by the residual etchant gas after an etching process is completed on a wafer in the main chamber. A potential particle contamination problem caused by the etched metal surface is thus avoided.

In a typical etching process for a metallization layer on an IC device, for instance, for a metallization layer formed of aluminum or aluminum alloys with copper, tungsten, etc an etchant gas of $Cl_2$ or $BCl_3$, and more likely a mixture of $Cl_2$ and $BCl_3$ is used. The mix ratio of the etchant gasses can be suitably controlled by their individual flow rate into the etch chamber. For instance, for etching aluminum, a suitable mix ratio of $Cl_2$ $BCl_3$ may be between 0.5:1 and 4:1. A suitable flow rate for the gases is usually between 100 Sccm and 500

Sccm, which presents a chamber pressure between 5 mTorr and 25 mTorr. For certain applications in etching metallization layers, i.e. specifically in the etching of via or contact holes, another etchant gas of polymeric nature such as $CHF_3$ or $CF_4$ may also be used such that sidewall passivation may be formed of the polymeric material to further enhance anisotropic etch effect, i.e. a more vertical aluminum sidewall after etching can be obtained. A preferred mixed ratio of $Cl_2$ and $BCl_3$ is between 2:1 and 4:1.

Figure 1:
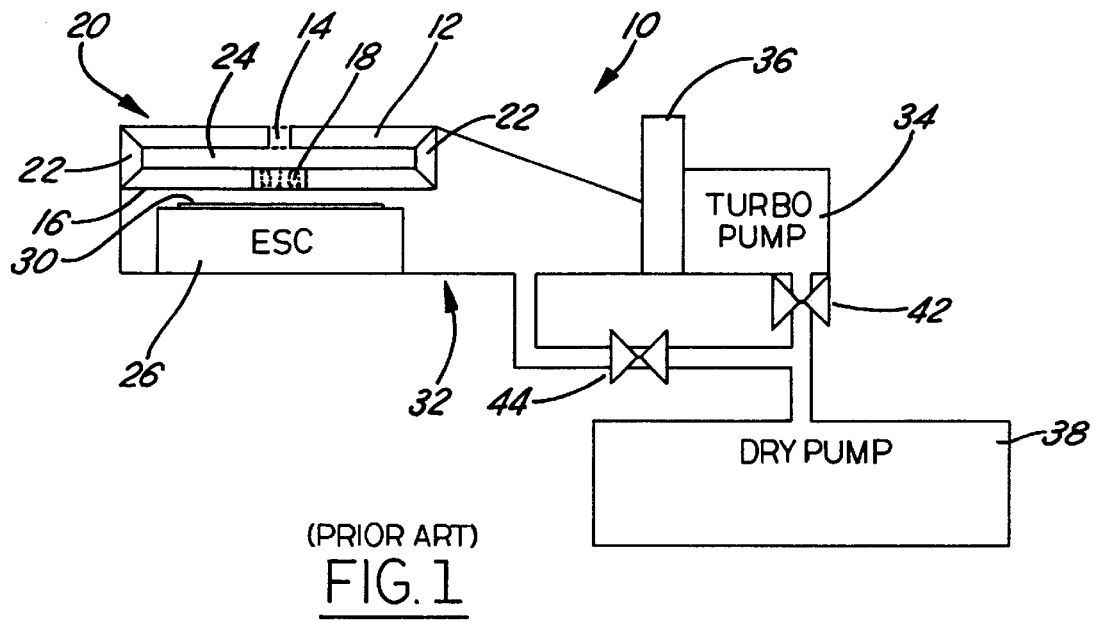
FIG. 1 is a graph illustrating a conventional transformer-coupled plasma etch chamber including a middle chamber and a main chamber.
Figure 2:
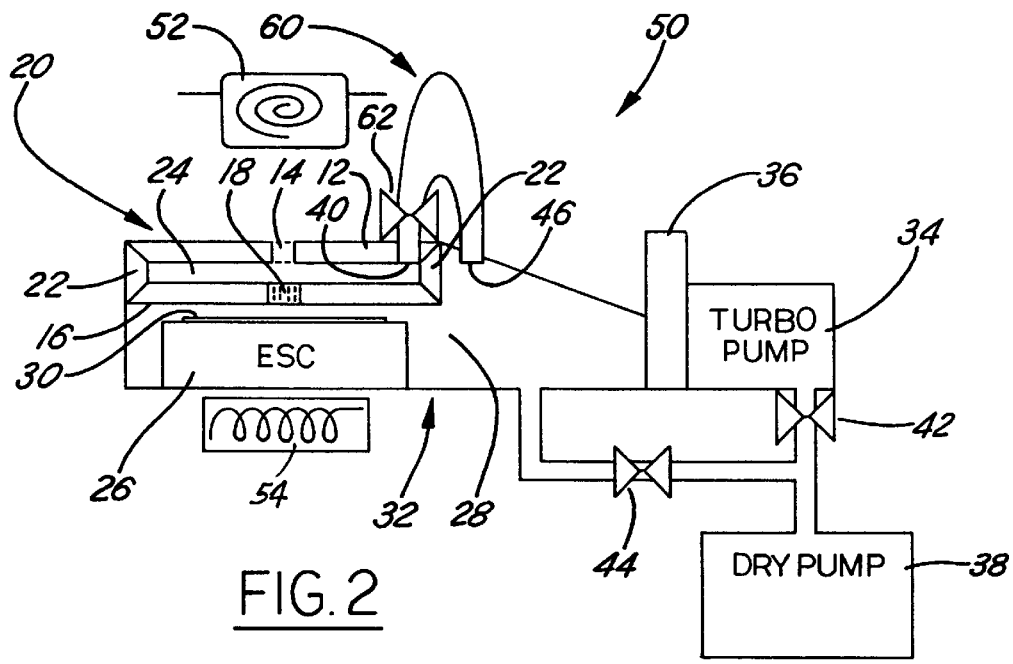
FIG. 2 is a graph illustrating a present invention transformer-coupled plasma etch chamber that is equipped with a bypass exhaust conduit for preventing corrosion in the middle chamber by residual etchant gas.

In the high plasma density reactor shown in FIG. 2, of the transformer-coupled type, a desirable aluminum etch rate can be obtained by suitably adjusting the mix ratio of $Cl_2$ and $BCl_3$. For instance, when an eight inch wafer is positioned on an electrostatic chuck for conducting an etching process, a mix ratio of 4:1 of $Cl_2$ $BCl_3$ can be suitably used to achieve a total flow rate of 300 Sccm and a chamber pressure of about 20 mTorr. Under such etch conditions, a desirable etch rate between 10,000 Å/min and 13,000 Å/min can be achieved.

Referring now to FIG. 2, wherein an illustration of the present invention transformer-coupled plasma etch chamber 30 is shown. The plasma etch chamber 50 is constructed of a middle chamber 20 situated inside a main chamber 32 with the middle chamber 20 suspended over an electrostatic chuck 26 for holding a wafer 30 thereon. The middle chamber is constructed by a top ceramic plate 12, a bottom ceramic plate 16 and a metal sidewall 22. A gas inlet 14 is provided at a center of the top ceramic plate 12 for flowing in either an etchant gas mixture or an inert purge gas. A shower head 18 is provided at the center of the bottom ceramic plate 16 which is provided with small diameter openings for dispersing an etchant gas plasma into the chamber cavity 28 of the main chamber 32. A first electrode in the form of a RF coil 52 is positioned over the middle chamber 20 which works in combination with a second electrode 54 connected to the electrostatic chuck 26 for igniting a plasma in the etchant gas mixture within cavity 24 in the middle chamber 20.

After an etching process has been conducted on wafer 30 positioned on top of the electrostatic chuck 26, and the wafer 30 is subsequently removed, the cavity 28 of the main chamber 32 is evacuated by a turbo pump 34 through a gate valve 36. Typically, a high flow rate turbo pump 34 is used for providing high flow rates at very low chamber pressures. For instance, in one configuration, the turbo pump 34 is capable of pumping about 50 Sccm at a low pressure of about 1 mTorr, and at a substantially higher rate such as 300 Sccm at a higher pressure of about 4 mTorr. When the chamber pressure is significantly higher, i.e. higher than 200 mTorr, the turbo pump cannot be used for fear of damages to the pump. Under a high chamber pressure condition, the flow control valve 42 for the turbo pump 34 can be closed while the flow control valve 44 can be opened to evacuate cavity 28 in the main chamber 32 by the dry pump 38 directly.

The present invention novel bypass exhaust conduit 60, as shown in FIG. 2, is connected to the cavity 24 in the middle chamber 20 at opening 40 and to the cavity 28 of the main chamber 32 at opening 46. The direct connection between the middle chamber cavity and the main chamber cavity allows a rapid evacuation of any residual etchant gas left in the middle chamber cavity while the main chamber cavity is evacuated by either the turbo pump 34 or the dry pump 38. The rapid evacuation can be effectively used to empty the middle chamber cavity such that no etchant gas is left behind to corrode the metallic sidewall 22 which is frequently made of aluminum. Any potential particle contamination problem caused by the metal corrosion can thus be avoided. The bypass exhaust conduit 60 of the present invention can be controlled by a control valve 62 positioned at near the opening 40 to the middle chamber cavity 24.

The present invention novel apparatus and method for preventing an etch chamber from particle contamination caused by corrosion of a metal sidewall in a middle chamber by residual etchant gas has therefore been amply described in the above description and in the appended drawing of FIG. 2.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A plasma etch chamber comprising:

a main chamber having a first cavity, a wafer platform and a spent etchant gas outlet in fluid communication with a pump means for exhausting a spent etchant gas;

a middle chamber having a second cavity therein situated inside said first cavity and suspended over said wafer platform, said first cavity in said main chamber has a volume that is at least twice the volume of said second cavity in said middle chamber;

said middle chamber being formed by a top ceramic plate, a bottom ceramic plate and a metal sidewall;

said second cavity being in fluid communication with said first cavity through an apertured opening situated in said bottom ceramic plate for feeding an etchant gas plasma into said first cavity, said second cavity being in fluid communication with an etchant gas source through an etchant gas inlet situated in said top ceramic plate; and a bypass conduit providing fluid communication between said second cavity in said middle chamber through an opening in said top ceramic plate and said first cavity in said main chamber such that any residual etchant gas in said second cavity is evacuated by said pump means through said first cavity without causing corrosion in said metal sidewall of said middle chamber.

2. A plasma etch chamber according to claim 1, wherein said wafer platform is an electrostatic chuck.

3. A plasma etch chamber according to claim 1, wherein said apertured opening in said bottom ceramic plate is a shower head for dispersing an etchant gas plasma into said first cavity of said main chamber.

4. A plasma etch chamber according to claim 1, wherein said bypass exhaust conduit allows said residual etchant gas to flow therethrough at a flow rate at least twice the flow rate of said residual etchant gas flown through said apertured opening in said bottom ceramic plate.

5. A plasma etch chamber according to claim 1, wherein said spent etchant gas outlet being in fluid communication with a turbo pump.

6. A plasma etch chamber according to claim 1, wherein said spent etchant gas outlet being in fluid communication with a pump through a gate valve for controlling a passageway of said spent etchant gas.

7. A plasma etch chamber according to claim 1, wherein said top ceramic plate, and said bottom ceramic plate being formed of a ceramic material that is resistant to said etchant gas plasma.

8. A plasma etch chamber according to claim 1, wherein said metal sidewall of said middle chamber being formed of aluminum.

9. A plasma etch chamber according to claim 1, wherein said etchant gas plasma being formed of at least one gas selected from the group consisting of $Cl_2$ and $BCl_3$ in said middle chamber by a radio frequency coil.

* * * * *